United States Patent [19]

Okumura

[11] Patent Number: 5,760,444
[45] Date of Patent: Jun. 2, 1998

[54] SILICON ON INSULATOR TYPE SEMICONDUCTOR DEVICE

[75] Inventor: Koichiro Okumura, Tokyo, Japan

[73] Assignee: NEC Corporation, Tokyo, Japan

[21] Appl. No.: 658,953

[22] Filed: May 31, 1996

[30] Foreign Application Priority Data

May 31, 1995 [JP] Japan .................................. 7-133705

[51] Int. Cl.⁶ .................................................. H01L 29/784
[52] U.S. Cl. ........................... 257/350; 257/356; 257/362
[58] Field of Search .............................. 257/347, 350, 257/355, 356, 357, 361, 362, 368

[56] References Cited

U.S. PATENT DOCUMENTS 5,229,635  7/1993  Bessolo et al. ....................... 257/362

FOREIGN PATENT DOCUMENTS 2-214165  8/1990  Japan .................................. 257/355

OTHER PUBLICATIONS

The ESD Protection Capability of SOI Snapback NMOS-FETS: Mechanisms And Failure Modes; Koen Verhaege et al. ; pp.215–219.

*Primary Examiner*—Donald Monin

[57] ABSTRACT

The present invention provides a silicon on insulator type semiconductor device including a transistor, a diode and a power source line. The transistor includes an insulator, a silicon film with which the insulator is selectively covered to form a device formation region, a gate insulating film with which the device formation region is covered, a gate electrode formed on the gate insulating film, a region having first conductivity and formed in the silicon film below the gate electrode across the gate insulating film, and source and drain regions both having second conductivity and formed in the silicon film in self-aligned fashion about the gate electrode so that the region is sandwiched between the source and drain regions. The diode is in electrical connection with the transistor through the drain region. Both the diode and the source region of the transistor are electrically connected to the power source line. Thus, the diode is forward biased to provide a path for electric charges running therethrough when an excessive negative or positive potential is applied to the drain region of the transistor. As a result, the invention provides an SOI semiconductor device having improved resistance to electrostatic breakdown relative to a conventional SOI semiconductor device.

19 Claims, 10 Drawing Sheets

SILICON ON INSULATOR TYPE SEMICONDUCTOR DEVICE

BACKGROUND OF THE INVENTION

1. Field of the Invention

The invention relates to a silicon on insulator (hereinafter, referred to simply as "SOI") type semiconductor device, and more particularly to an output buffer of an IGFET-SOI semiconductor device.

2. Description of the Prior Art

These days, there has been increased a demand for higher speed operation of a semiconductor integrated circuit. Thus, a CMOS integrated circuit formed on an SOI substrate now attracts attention as a structure which is capable of operating a CMOS integrated circuit at higher speed. Hereinbelow is explained an output buffer in a CMOS integrated circuit formed on an SOI substrate with reference to FIG. 1A which is a plan view of an output buffer, and also to FIG. 1B which is a cross-sectional view taken along the line A—A in FIG. 1A.

In FIG. 1A, there are arranged a p-channel MOS FET (hereinafter, referred to simply as "PMOS") at an upper stage and an n-channel MOS FET (hereinafter, referred to simply as "NMOS") at a lower stage. A gate electrode 7-1 composed of an n-type polysilicon film, a p-type source region 9ps and a p-type drain region 9pd constitute PMOS. The p-type source and drain regions 9ps and 9pd sandwich a lightly doped n-type region 8n disposed just below the gate electrode 7-1 therebetween, and are self-aligned about the gate electrode 7-1. Similarly, a gate electrode 7-2 composed of an n-type polysilicon film, an n-type source region 9ns and an n-type drain region 9nd constitute NMOS. The n-type source and drain regions 9ns and 9nd sandwich a lightly doped p-type region 8p disposed just below the gate electrode 7-2 therebetween, and are self-aligned about the gate electrode 7-2. The gate electrodes 7-1 and 7-2 are connected to each other in series and are further connected to an input signal line 16B composed of an n-type polysilicon film. The p-type source region 9ps is electrically connected to a first power supply line 14B composed of aluminum alloy through a contact hole C1 so that a power supply (not illustrated) provides a supply voltage Vdd to the p-type source region 9ps. The n-type source region 9ns is electrically connected to a second power supply line 15B composed of aluminum alloy through a contact hole C1 so that a grounding voltage GND is provided to the n-type source region 9ns. Each of the p-type and n-type drain regions 9pd and 9nd is electrically connected to an output signal line 17B composed of an aluminum alloy film through a contact hole C3.

In a silicon substrate 1 is formed a buried oxide film 2 composed of a silicon dioxide film. A silicon film lying on the buried oxide film 2 is separated into an island-like shape by a plurality of field oxides 3 composed of a silicon dioxide film to thereby define device formation regions 4p and 5n.

A gate insulating film 6-1 covers the device formation region 4p therewith, and on the gate insulating film 6-1 is formed the gate electrode 7-1. The p-type source and drain regions 9ps and 9pd, both of which have a depth reaching the buried oxide film 2 and contain highly concentrated p-type impurity at a dose of about $1\times10^{20}$ cm$^{-3}$, are formed in self-aligning fashion about the first gate electrode 7-1. In the silicon film just beneath the first gate electrode 7-1 is formed a lightly doped n-type region 8n in which a channel of PMOS is to be formed and which contains low-concentrated n-type impurity at a dose of about $1\times10^{17}$ cm$^{-3}$.

Similarly, a gate insulating film 6-2 covers the device formation region 5n therewith, and on the gate insulating film 6-2 is formed the gate electrode 7-2. The n-type source and drain regions 9ns and 9nd, both of which have a depth reaching the buried oxide film 2 and contain highly-concentrated n-type impurity at a dose of about $1\times10^{20}$ cm$^{-3}$, are formed in self-aligning fashion about the gate electrode 7-2. In the silicon film just beneath the gate electrode 7-2 is formed a lightly doped p-type region 8p in which a channel of NMOS is to be formed and which contains low-concentrated p-type impurity at a dose of about $1\times10^{17}$ cm$^{-3}$.

The p-type source region 9ps is electrically connected to the first power supply line 14B through the contact hole C1 formed through an interlayer insulating film 13, and the n-type source region 9ns is electrically connected to the second power supply line 15B through the contact hole C2 formed through the interlayer insulating film 13.

In the above mentioned SOI semiconductor device formed using an SOI substrate, both the p-type drain region 9pd of PMOS and the n-type drain region 9nd of NMOS are in contact at lower surfaces thereof with the buried oxide film 2 which is relatively thick, specifically having a thickness of about 400 nm, to thereby lower a diffusion layer capacity. As a result, as is known in the art, higher speed operation can be accomplished.

Hereinbelow will be explained a method of fabricating the above mentioned output buffer of CMOS integrated circuit.

First, to a silicon substrate is carried out SIMOX (Separation by Implanted Oxygen) wherein oxygen ions are implanted to a silicon substrate, followed by thermal annealing of the silicon substrate to thereby form a buried oxide layer in the silicon substrate, thereby forming a pad oxide film 17a and a silicon nitride film 18 on an SOI substrate consisting of a silicon substrate 1, a buried oxide film 2 and a silicon film 8, as illustrated in FIG. 2A. Then, the silicon nitride film 18 is etched by using a patterned photoresist 19A as a mask to thereby separate the silicon film 8 into device formation regions. Then, after removal of the photoresist 19A, the silicon film 8 is selectively oxidized by using the silicon nitride film 18 as a mask to thereby form a plurality of field oxides 3 defining the device formation regions therein, as illustrated in FIG. 2B. The silicon nitride film 18 and pad oxide film 17a are removed, and then silicon dioxide films 10 having a thickness of 20 nm are made grown on the silicon film 8.

Then, a region other than a region in which NMOS is to be formed is covered with photoresist 20A, followed by ion-implanting of boron (B) at 50 KeV at a dose of $1\times10^{12}$ cm$^{-2}$ by using the photoresist 20A as a mask. As a result, there is formed the lightly doped p-type region 8p, as illustrated in FIG. 2C. Then, after removal of the photoresist 20A, a region other than a region in which PMOS is to be formed is covered with photoresist 21A, followed by ion-implanting of phosphorus (P) at 50 KeV at a dose of about $1\times10^{12}$ cm$^{-2}$. As a result, there is formed the lightly doped n-type region 8n illustrated in FIG. 2D.

After removal of the photoresist 21A and the silicon dioxide films 10, gate oxide films 6-1 and 6-2 having a thickness of 10 nm are made grown on the lightly doped p-type and n-type regions 8p and 8n. Then, polysilicon films having a thickness of 300 nm are deposited over the gate oxide films 6-1 and 6-2, followed by diffusion of phosphorus (P) at 850° C. for about 30 minutes. Then, a photoresist using step is carried out to thereby form the gate electrodes 7-1 and 7-2 both composed of a heavily doped n-type polysilicon film.

Then, as illustrated in FIG. 2D, a region other than a region in which NMOS is to be formed is covered with photoresist 22A, followed by ion-implanting of arsenic (As) at 70 KeV at a dose of about $5 \times 10^{16}$ cm$^{-2}$. As a result, there are formed the n-type source region 9ns and the n-type drain region 9nd illustrated in FIG. 2E. Since a region disposed just beneath the NMOS gate electrode 7-2 is not doped with arsenic, the region remains as it is as the lightly doped p-type region 8p.

Then, subsequently to removal of the photoresist 23A, a region other than a region in which PMOS is to be formed is covered with photoresist (not illustrated), followed by ion-implanting of BF$_2$ at 50 KeV at a dose of about $5 \times 10^{15}$ cm$^{-2}$. As a result, there are formed the p-type source region 9ps and p-type drain region 9pd illustrated in FIGS. 1A and 1B. Since a region disposed just beneath the gate electrode 7-1 is not doped with BF$_2$, the region remains as it is as the lightly doped n-type region 8n.

Then, a resultant is covered with an interlayer insulating film 13, through which the contact holes C1 to C3 are formed. Then, there are formed the first power supply line 14B, second power supply line 15 and output signal line 17B.

In the above mentioned conventional SOI semiconductor device, the p-type drain region 9pd of PMOS is in contact at a lower surface thereof with the buried oxide film 2, and the lightly doped n-type region 8n or n-type body region in contact with a side surface of the p-type drain region 9pd has a floating voltage when the SOI semiconductor is not in operation. Thus, if a great positive voltage is applied to the output signal line 17B for some reasons, there is no path for electric charges to be discharged therethrough. This is similar when a negative voltage is applied to the output signal line 17B. Namely, the n-type drain region 9nd of NMOS is in contact at a lower surface thereof with the buried oxide film 2, and the lightly doped p-type region 8p or p-type body region in contact with a side surface of the n-type drain region 9nd has a floating voltage when the SOI semiconductor is not in operation. Thus, if a great negative voltage is applied to the output signal line 17B for some reasons, there is no path for electric charges to be discharged therethrough. Accordingly, there has been reported a problem of reduction in resistance of an output buffer against electrostatic breakdown in a conventional SOI semiconductor device. For instance, Koen Verhaege et al. has reported in EOS/EDS (Electrical Overstress/Electrostatic Discharge) Symposium, 1993, pp. (93-215)–(93-219) that the resistance to electrostatic breakdown measured when a negative voltage is applied to a drain of an SOI-structured NMOS with a source thereof being grounded is lower than the resistance to electrostatic breakdown measured when a positive voltage is applied to the same drain, in which case the SOI-structured NMOS is fabricated by using a SIMOX substrate.

This fact can be analyzed as follows.

When a positive voltage is applied to a drain beyond a breakdown voltage of the drain, there occurs NPN bipolar transistor operation in which source, body and drain act as emitter, base and collector, respectively, with generation of holes caused by impact ionization in a drain end acting as a trigger, similarly to NMOS formed in a p-type well of an ordinary silicon substrate. A mass of electrons are provided to the drain through such NPN bipolar transistor operation, resulting in that a voltage at the drain end can be relatively effectively lowered. Thus, it is possible to obtain practicable resistance against electrostatic breakdown, though it is inferior to the resistance against electrostatic breakdown of CMOS formed in an ordinary silicon substrate.

When a negative voltage is applied to a drain of NMOS formed in a p-type well of an ordinary silicon substrate, a diode junction formed by an n-type drain and a p-type well is forward biased. As a result, electrons flow to the p-type well, and further to a grounding line through a well contact formed between the p-type well and the grounding line, thereby a negative potential being decreased. On the other hand, when a negative voltage is applied to a drain of an SOI-structured NMOS, electrons flowing into a p-type body region through a diode comprising an n-type drain region and the p-type body region cannot have a path to flow out of the p-type body region therethrough, because the p-type body region has a floating voltage. Thus, electrons stay in the p-type body region. When the drain and body regions come to have a negative voltage, a gate and a source come to have a positive voltage, considering the drain as a standard. Thus, a channel is formed on a surface of the p-type body region to thereby turn NMOS on, resulting in that electrons flow into a source from a drain to thereby reduce a negative voltage. However, a characteristic of a MOS transistor allows to flow a restricted amount of current, and thus, the resistance against electrostatic breakdown becomes further lower than the resistance measured on application of a positive voltage. This is a remarkable obstacle for putting an SOI-structured to practical use.

A problem as mentioned above would arise in an open drain type output buffer. As an example, an open drain type SOI-structured NMOS is illustrated in FIG. 3, a plan view. A certain supply voltage is provide to an open drain output signal line 17C through a pull-up resistance (not illustrated) from a voltage supply (not illustrated) disposed outside an SOI chip.

As discussed above, since a conventional SOI semiconductor device does not have a path through which an excessive voltage is to be discharged, there arises a problem that a resistance against electrostatic breakdown in an output buffer is reduced.

SUMMARY OF THE INVENTION

In view of the foregoing problem of the prior SOI semiconductor device, it is an object of the present invention to provide an SOI semiconductor device which, even if an excessive voltage is applied to an output terminal, can rapidly attenuate the voltage.

The present invention provides a silicon on insulator type semiconductor device including: an insulator; a silicon film with which the insulator is selectively covered to form a device formation region; a gate insulating film with which the device formation region is covered; a gate electrode formed on the gate insulating film; a first lightly doped region having first conductivity and formed in the silicon film below the gate electrode across the gate insulating film; heavily doped source and drain regions both having second conductivity and formed in the silicon film in self-aligned fashion about the gate electrode so that the first lightly doped region is sandwiched between the source and drain regions, the insulator, silicon film, gate insulating film, gate electrode, first lightly doped region and heavily doped source and drain regions constituting a transistor; a second lightly doped region having first conductivity and formed in the silicon film in adjacent relation to the heavily doped drain region; a heavily doped region having first conductivity and formed in the silicon film in adjacent relation to the second lightly doped region; a power supply line electrically connected to both the heavily doped source region and the heavily doped region; an input signal line electrically connected to the gate electrode; and an output signal line electrically connected to the heavily doped drain region.

Herein, there is assumed that the above mentioned SOI semiconductor device is constructed as an n-channel IGFET, and that the first conductivity is p-type and the second conductivity is n-type. When a positive excessive voltage is applied to the output signal line, an NPN bipolar transistor constituted of the N+ drain region, the first lightly doped p-type region and the N+ source region is turned on, whereas when a negative excessive voltage is applied to the output signal line, a PN diode constituted of the P+-type region, the second lightly doped p-type region and the N+-type drain region is turned on. If the above mentioned SOI semiconductor device is constructed as a p-channel IGFET, when a negative excessive voltage is applied to the output signal line, a PNP bipolar transistor constituted of the P+ drain region, the first lightly doped n-type region and the P+ source region is turned on, whereas when a positive excessive voltage is applied to the output signal line, a PN diode constituted of the P+-type drain region, the second lightly doped p-type region and the N+-type region is turned on.

In a preferred embodiment, the SOI semiconductor device further includes a second gate electrode formed on the second lightly doped region across a second gate insulating film and electrically connected to the power supply line, in which case the heavily doped drain region and the heavily doped region are self-aligned about the second gate electrode.

In the above mentioned embodiment, since the second lightly doped region is self-aligned with the second gate electrode, there is provided an advantage of smaller dispersion in dimension.

The present invention further provides a silicon on insulator type semiconductor device including: an insulator; a first silicon film with which the insulator is selectively covered to form a first device formation region; a first gate insulating film with which the first device formation region is covered; a first gate electrode formed on the first gate insulating film; a first lightly doped region having first conductivity and formed in the first silicon film below the first gate electrode across the first gate insulating film; first heavily doped source and drain regions both having second conductivity and formed in the first silicon film in self-aligned fashion about the first gate electrode so that the first lightly doped region is sandwiched between the first source and drain regions, the insulator, first silicon film, first gate insulating film, first gate electrode, first lightly doped region and heavily doped first source and drain regions constituting a first transistor having a second conductivity channel; a second lightly doped region having first conductivity and formed in the first silicon film in adjacent relation to the first heavily doped drain region; a first heavily doped region having first conductivity and formed in the first silicon film in adjacent relation to the second lightly doped region; a second silicon film with which the insulator is selectively covered to form a second device formation region; a second gate insulating film with which the second device formation region is covered; a second gate electrode formed on the second gate insulating film; a third lightly doped region having second conductivity and formed in the second silicon film below the second gate electrode across the second gate insulating film; second heavily doped source and drain regions both having first conductivity and formed in the second silicon film in self-aligned fashion about the second gate electrode so that the third lightly doped region is sandwiched between the second source and drain regions, the insulator, second silicon film, second gate insulating film, second gate electrode, third lightly doped region and heavily doped second source and drain regions constituting a second transistor having a first conductivity channel; a fourth lightly doped region having second conductivity and formed in the second silicon film in adjacent relation to the heavily doped second drain region; a second heavily doped region having second conductivity and formed in the second silicon film in adjacent relation to the fourth lightly doped region; a first power supply line electrically connected to both the first heavily doped source region and the first heavily doped region; a second power supply line electrically connected to both the second heavily doped source region and the second heavily doped region; an input signal line electrically connected to both the first and second gate electrodes; and an output signal line electrically connected to both the heavily doped first and second drain regions.

On the assumption that the first conductivity is n-type and the second conductivity is p-type, when a positive excessive voltage is applied to the output signal line, an NPN bipolar transistor constituted of the N+ drain region, the first lightly doped p-type region and the N+ source region is turned on, and a PN diode constituted of the P+-type drain region, the second lightly doped p-type region and the N+-type region is also turned on. When a negative excessive voltage is applied to the output signal line, a PN diode constituted of the P+-type region, the second lightly doped p-type region and the N+-type drain region is turned on.

In a preferred embodiment, the SOI semiconductor device may further include a third gate electrode formed on the second lightly doped region across a third gate insulating film and electrically connected to the first power supply line, and a fourth gate electrode formed on the fourth lightly doped region across a fourth gate insulating film and electrically connected to the second power supply line. The first heavily doped drain region and the first heavily doped region are self-aligned about the third gate electrode, and the second heavily doped drain region and the second heavily doped region are self-aligned about the fourth gate electrode.

In the above mentioned embodiment, since the second and fourth lightly doped regions are self-aligned with the third and fourth gate electrodes, respectively, there is provided an advantage of smaller dispersion in dimension.

The present invention still further provides a silicon on insulator type semiconductor device including: an insulator; a silicon film with which the insulator is selectively covered to form a device formation region; a gate insulating film with which the device formation region is covered; a gate electrode formed on the gate insulating film; a first lightly doped region having first conductivity and formed in the silicon film below the gate electrode across the gate insulating film; heavily doped source and drain regions both having second conductivity and formed in the silicon film in self-aligned fashion about the gate electrode so that the first lightly doped region is sandwiched between the source and drain regions, the insulator, silicon film, gate insulating film, gate electrode, first lightly doped region and heavily doped source and drain regions constituting a transistor; a second lightly doped region having second conductivity and formed in the silicon film in adjacent relation to the heavily doped drain region; a heavily doped region having first conductivity and formed in the silicon film in adjacent relation to the second lightly doped region; a power supply line electrically connected to both the heavily doped source region and the heavily doped region; an input signal line electrically connected to the gate electrode; and an output signal line electrically connected to the heavily doped drain region.

Herein, there is assumed that the above mentioned SOI semiconductor device is constructed as an n-channel IGFET, and that the first conductivity is p-type and the second conductivity is n-type. When a positive excessive voltage is applied to the output signal line, an NPN bipolar transistor constituted of the N+ drain region, the first lightly doped p-type region and the N+ source region is turned on, whereas when a negative excessive voltage is applied to the output signal line, a PN diode constituted of the P+-type region, the second lightly doped n-type region and the N+-type drain region is turned on. If the above mentioned SOI semiconductor device is constructed as a p-channel IGFET, when a negative excessive voltage is applied to the output signal line, a PNP bipolar transistor constituted of the P+-type drain region, the first lightly doped n-type region and the P+-type source region is turned on, whereas when a positive excessive voltage is applied to the output signal line, a PN diode constituted of the P+-type drain region, the second lightly doped n-type region and the N+-type region is turned on.

The present invention yet further provides a silicon on insulator type semiconductor device including: an insulator; a first silicon film with which the insulator is selectively covered to form a first device formation region; a first gate insulating film with which the first device formation region is covered; a first gate electrode formed on the first gate insulating film; a first lightly doped region having first conductivity and formed in the first silicon film below the first gate electrode across the first gate insulating film; first heavily doped source and drain regions both having second conductivity and formed in the first silicon film in self-aligned fashion about the first gate electrode so that the first lightly doped region is sandwiched between the first source and drain regions, the insulator, first silicon film, first gate insulating film, first gate electrode, first lightly doped region and heavily doped first source and drain regions constituting a first transistor having a second conductivity channel; a second lightly doped region having second conductivity and formed in the first silicon film in adjacent relation to the first heavily doped drain region; a first heavily doped region having first conductivity and formed in the first silicon film in adjacent relation to the second lightly doped region; a second silicon film with which the insulator is selectively covered to form a second device formation region; a second gate insulating film with which the second device formation region is covered; a second gate electrode formed on the second gate insulating film; a third lightly doped region having second conductivity and formed in the second silicon film below the second gate electrode across the second gate insulating film; second heavily doped source and drain regions both having first conductivity and formed in the second silicon film in self-aligned fashion about the second gate electrode so that the third lightly doped region is sandwiched between the second source and drain regions, the insulator, second silicon film, second gate insulating film, second gate electrode, third lightly doped region and heavily doped second source and drain regions constituting a second transistor having a first conductivity channel; a fourth lightly doped region having first conductivity and formed in the second silicon film in adjacent relation to the heavily doped second drain region; a second heavily doped region having second conductivity and formed in the second silicon film in adjacent relation to the fourth lightly doped region; a first power supply line electrically connected to both the first heavily doped source region and the first heavily doped region; a second power supply line electrically connected to both the second heavily doped source region and the second heavily doped region; an input signal line electrically connected to both the first and second gate electrodes; and an output signal line electrically connected to both the heavily doped first and second drain regions.

On the assumption that the first conductivity is n-type and the second conductivity is p-type, when a positive excessive voltage is applied to the output signal line, an NPN bipolar transistor constituted of the N+ drain region, the first lightly doped p-type region and the N+ source region is turned on, and a PN diode constituted of the P+-type drain region, the second lightly doped p-type region and the N+-type region is also turned on. When a negative excessive voltage is applied to the output signal line, a PN diode constituted of the P+-type region, the second lightly doped n-type region and the N+-type drain region is turned on.

The present invention still yet further provides a silicon on insulator type semiconductor device including a transistor, a diode and a power source line, the transistor including: an insulator; a silicon film with which the insulator is selectively covered to form a device formation region; a gate insulating film with which the device formation region is covered; a gate electrode formed on the gate insulating film; a region having first conductivity and formed in the silicon film below the gate electrode across the gate insulating film; and source and drain regions both having second conductivity and formed in the silicon film in self-aligned fashion about the gate electrode so that the region is sandwiched between the source and drain regions, the diode being in electrical connection with the transistor through the drain region, both the diode and the source region of the transistor being electrically connected to the power source line so that the diode is forward biased to provide a path for electric charges running therethrough when an excessive potential is applied to the drain region of the transistor.

In accordance with the present invention, drain and source regions of an n- or p-channel IGFET are electrically connected to a power source line through a diode disposed adjacent to the drain region. Thus, when a negative or positive excessive voltage is instantaneously applied to an output signal line which is in electrical contact with the drain region, the diode is forward biased to thereby allow electric charges to run therethrough. Hence, the present invention provides an SOI semiconductor device having an enhanced resistance against electrostatic breakdown relative to a conventional SOI semiconductor device.

BRIEF DESCRIPTION OF THE DRAWINGS

The above and other objects and advantageous features of the present invention will be made apparent from the following description made with reference to the accompanying drawings, in which like reference characters designate the same or similar parts throughout the drawings, in which.

DESCRIPTION OF THE PREFERRED EMBODIMENTS

Figure 4A:
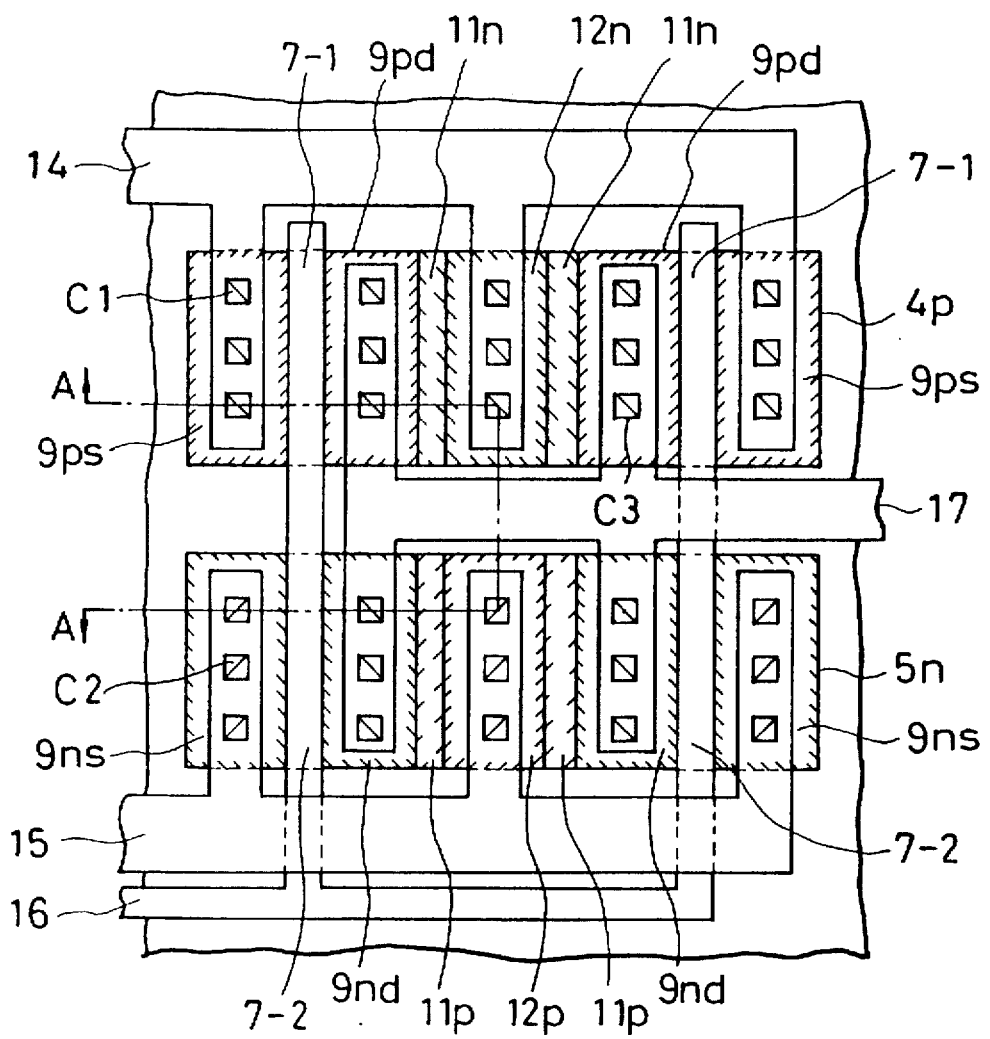
FIG. 4A is a plan view illustrating an output buffer of an SOI semiconductor device made in accordance with the first embodiment of the present invention.
Figure 4B:
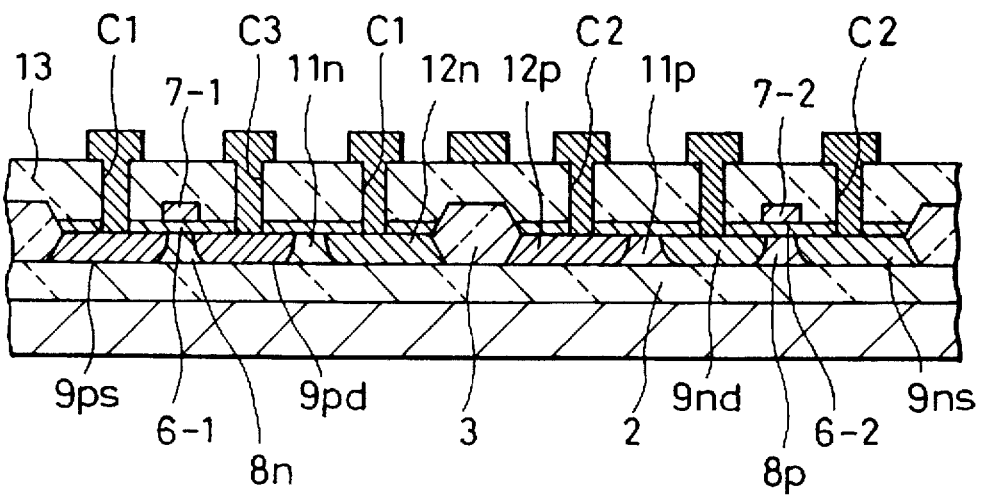
FIG. 4B is a cross-sectional view taken along the line A—A in FIG. 4A.

With reference to FIGS. 4A and 4B, an SOI semiconductor device to be fabricated in accordance with the first embodiment of the present invention includes a p-channel MOS FET and a PN diode formed adjacent to the p-channel MOS FET, an n-channel MOS FET and an NP diode formed adjacent to the n-channel MOS FET, and an output buffer.

The p-channel MOS FET includes a buried oxide film 2 acting as an insulator, a first silicon film selectively covering the buried oxide film 2 to thereby form a first device formation region 4p, a first gate insulating film 6-1 with which the first device formation region 4p is covered, a first gate electrode 7-1 formed on the first gate insulating film 6-1, a first lightly doped n-type region 8n containing impurities at a dose of about $1 \times 10^{17}$ cm$^{-3}$ and formed in the first silicon film just beneath the first gate electrode 7-1 across the first gate insulating film 6-1, and heavily doped p-type source and drain regions 9ps and 9pd both containing at a dose of $1 \times 10^{20}$ cm$^{-3}$ and formed in the first silicon film in self-aligned fashion about the first gate electrode 7-1 so that the first lightly doped n-type region 8n is sandwiched between the p-type source and drain regions 9ps and 9pd.

The SOI semiconductor device also includes a second lightly doped n-type region 11n formed in the first silicon film in adjacent relation to the heavily doped p-type drain region 9pd, and a first heavily doped n-type region 12n formed in the first silicon film in adjacent relation to the second lightly doped n-type region 11n. The p-type drain region 9pd, the second lightly doped n-type region 11n and the first heavily doped n-type region 12n cooperate with one another to constitute the PN diode.

The n-channel MOS FET includes a second silicon film with which the buried oxide film 2 is selectively covered to form a second device formation region 5n, a second gate insulating film 6-2 with which the second device formation region 5n is covered, a second gate electrode 7-2 formed on the second gate insulating film 6-2, a first lightly doped p-type region 8p containing impurities at a dose of about $1 \times 10^{17}$ cm$^{-3}$ and formed in the second silicon film just beneath the second gate electrode 7-2 across the second gate insulating film 6-2, and heavily doped n-type source and drain regions 9ns and 9nd both containing impurities at a dose of about $1 \times 10^{20}$ cm$^{-3}$ and formed in the second silicon film in self-aligned fashion about the second gate electrode 7-2 so that the first lightly doped p-type region 8p is sandwiched between the n-type source and drain regions 9ns and 9nd.

The SOI semiconductor device also includes a lightly doped p-type region 11p formed in the second silicon film in adjacent relation to the heavily doped n-type drain region 9nd, and a heavily doped p-typed region 12p formed in the second silicon film in adjacent relation to the lightly doped p-type region 11p. The n-type drain region 9nd, the lightly doped p-type region 11p and the heavily doped p-typed region 12p cooperate with one another to constitute the NP diode.

The output buffer includes a first power supply line (hereinafter, referred to as "$V_{DD}$ line") 14 electrically connected to both the heavily doped p-type source region 9ps and the heavily doped n-type region 12n, a second power supply line (hereinafter, referred to as "GND line") 15 electrically connected to both the heavily doped n-type source region 9ns and the heavily doped p-type region 12p, an input signal line 16 electrically connected to both the first and second gate electrodes 7-1 and 7-2, and an output signal line 17 electrically connected to both the heavily doped p-type and n-type drain regions 9pd and 9nd.

Figure 1A:
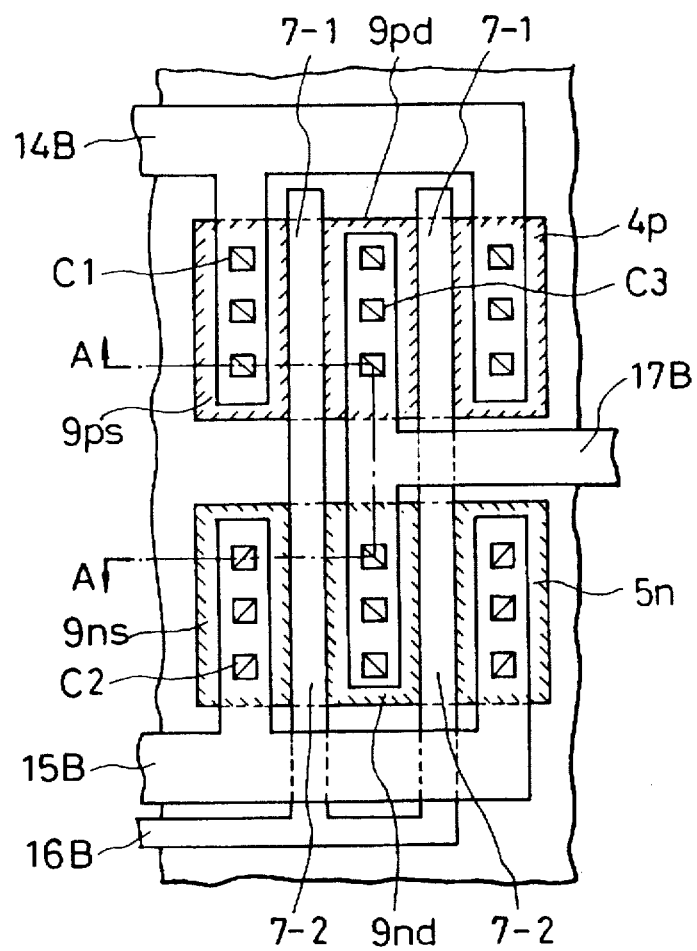
FIG. 1A is a plan view illustrating a conventional SOI semiconductor device.
Figure 1B:
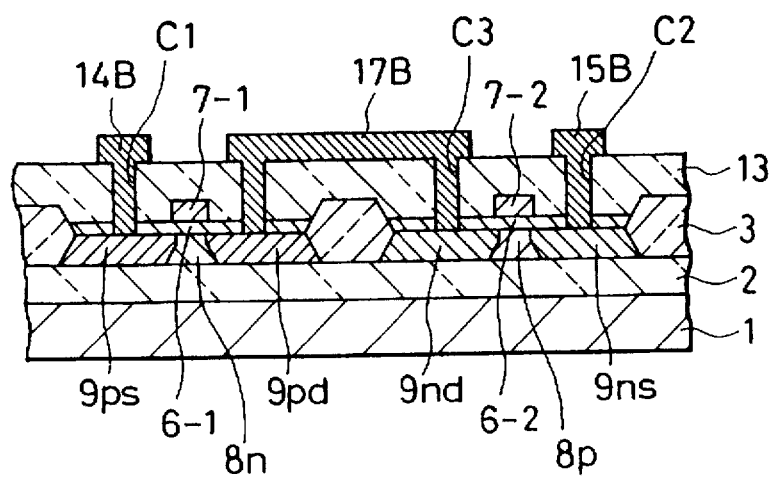
FIG. 1B is a cross-sectional view taken along the line A—A in FIG. 1A.
Figure 2A:
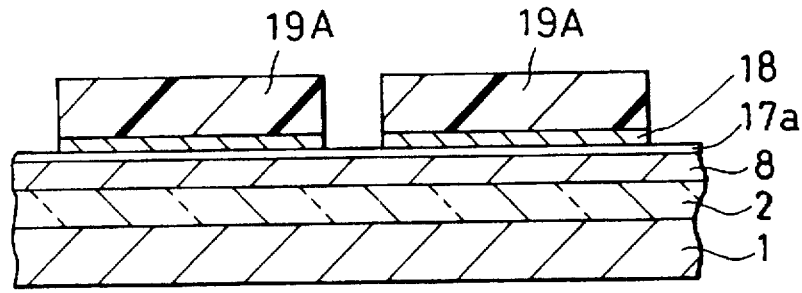
FIGS. 2A to 2E are cross-sectional views of the conventional SOI semiconductor device illustrated in FIGS. 1A and 1B, showing respective step of a method of fabricating the same.
Figure 2B:
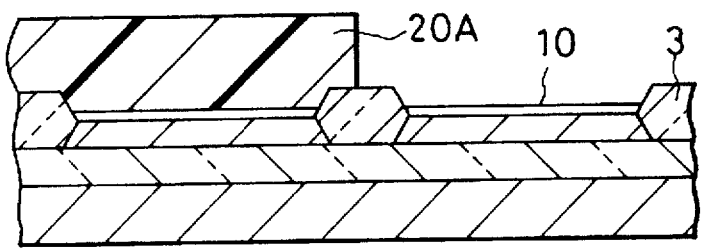
Figure 2C:
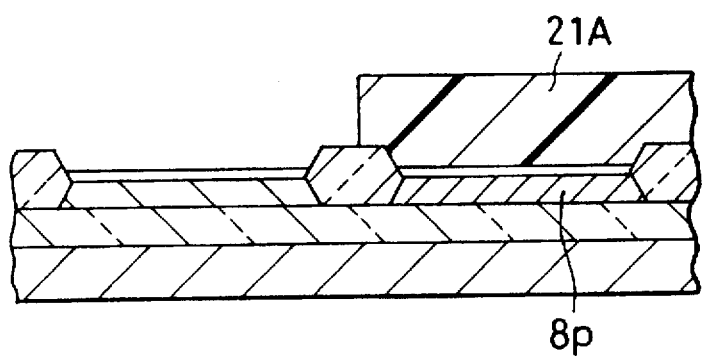
Figure 2D:
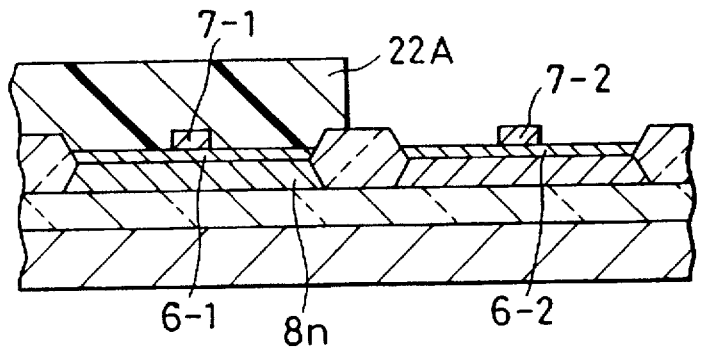
Figure 2E:
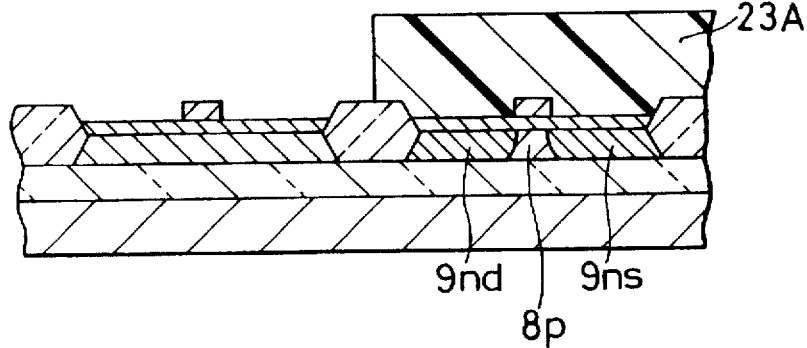
Figure 3:
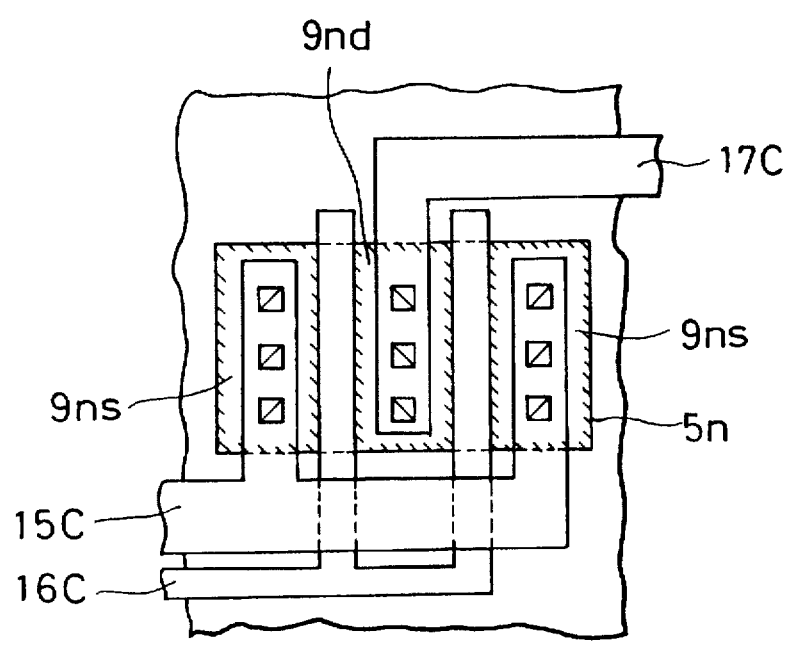
FIG. 3 is a plan view illustrating a variant of the conventional SOI semiconductor device.

When a negative voltage of about thousands of volts is instantaneously applied to the output signal line 17, the N+-P-P+ diode constituted of the n-type drain region 9nd, the second p-type region 11p and the heavily doped p-type region 12p is forward biased to thereby make it possible to provide electric charges to the output signal line 17 through the GND line 15. Thus, there can be obtained the enhanced resistance against electrostatic breakdown for a negative voltage relative to a conventional SOI semiconductor device illustrated in FIGS. 1A and 1B. The P+-N-P+ bipolar transistor constituted of the p+ type drain region 9pd, the first lightly doped n-type region 8n and the p+ type source region 9ps may be turned on, but it is not so effective for enhancing the resistance against electrostatic breakdown.

When a positive voltage of thousands of volts is instantaneously applied to the output signal line 17, the NPN bipolar transistor constituted of the n-type source region 9ns, the p-type body region or the first lightly doped p-type region 8p and the n-type drain region 9nd which act as an emitter, a base and a collector, respectively, is turned on to thereby cause electric charges to be discharged from the output signal line 17 to the GND line 15, similarly to a conventional SOI semiconductor device. In addition, the P+-N-N+ diode constituted of the p-type drain region 9pd, the second lightly doped n-type region 11n and the heavily doped n-type region 12n is forward biased to thereby discharge electric charges to the $V_{DD}$ line 14. Thus, there can be obtained the enhanced resistance against electrostatic breakdown also for a positive voltage relative to a conventional SOI semiconductor device illustrated in FIGS. 1A and 1B.

In normal operation, a supply voltage $V_{DD}$ (for instance, 3.3. V) is applied to the $V_{DD}$ line 14, and the GND line 15 is kept to be equal to a grounding voltage of 0 volt. Thus, the voltage amplitude of the output signal line 17 caused by input signals transmitted to the GND line 15 composed of polysilicon is in the range of 0 to $V_{DD}$ volts, and hence neither the P+-N-N+ diode nor the N+-P-P+ diode is forward biased, resulting in that no harmful influence exerts on operation of the SOI semiconductor device.

Hereinbelow is explained a method of fabricating the SOI semiconductor device of the first embodiment with reference to FIGS. 5A to 5E.

Figure 5A:
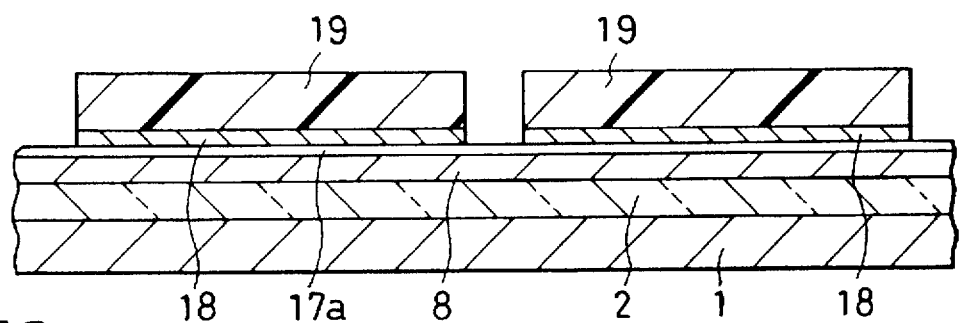
FIGS. 5A to 5E are cross-sectional views of the SOI semiconductor device illustrated in FIGS. 4A and 4B, showing respective step of a method of fabricating the same.

First, a pad oxide film 17a and a silicon nitride film 18 are formed on an SOI substrate having been fabricated by means of SIMOX (Separation by Implanted Oxygen) technique, as illustrated in FIG. 5A. The SOI substrate comprises a silicon substrate 1, a buried oxide film 2 and a silicon film 8. Then, the silicon nitride film 18 is etched by using a patterned photoresist 19 as a mask to thereby separate the silicon film 8 into device formation regions 5n and 4p.

Figure 5B:
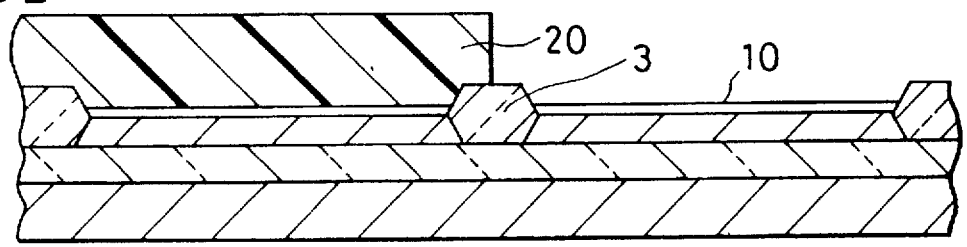
Figure 5C:
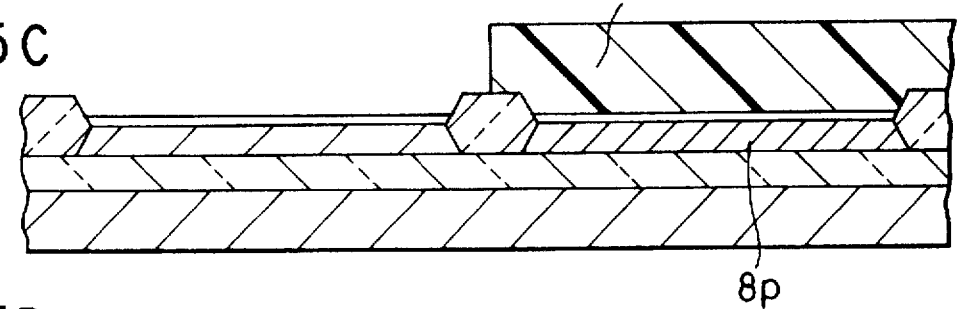

Then, after removal of the photoresist 19, the silicon film 8 is selectively oxidized by using the silicon nitride film 18 as a mask to thereby form a plurality of field oxides 3 defining the device formation regions therein, as illustrated in FIG. 5B. The silicon nitride film 18 and pad oxide film 17a are removed, and then silicon dioxide films 10 having a thickness of 20 nm are made grown on the silicon film 8.

Then, a region other than the device formation region 5n in which the NMOS and N+-P-P+ diode are to be formed is covered with photoresist 20, followed by ion-implanting of boron (B) at 50 KeV at a dose of $1 \times 10^{12}$ cm$^{-2}$ by using the photoresist 20 as a mask. As a result, there is formed the lightly doped p-type region 8p illustrated in FIG. 5C.

Then, after removal of the photoresist 20, a region other than the device formation region 4p in which the PMOS and P+-N-N+ are to be formed is covered with photoresist 21, followed by ion-implanting of phosphorus (P) at 50 KeV at a dose of about $1 \times 10^{12}$ cm$^{-2}$. As a result, there is formed the lightly doped n-type region 8n illustrated in FIG. 5D.

After removal of the photoresist 21 and the silicon dioxide films 10, gate oxide films 6-1 and 6-2 having a thickness of 10 nm are made grown on the lightly doped p-type and n-type regions 8p and 8n. Then, polysilicon films having a thickness of 300 nm are deposited over the gate oxide films 6-1 and 6-2, followed by diffusion of phosphorus (P) at 850° C. for about 30 minutes. Then, a photoresist using step is carried out to thereby form the first and second gate electrodes 7-1 and 7-2 both composed of a heavily doped n-type polysilicon film.

Figure 5D:
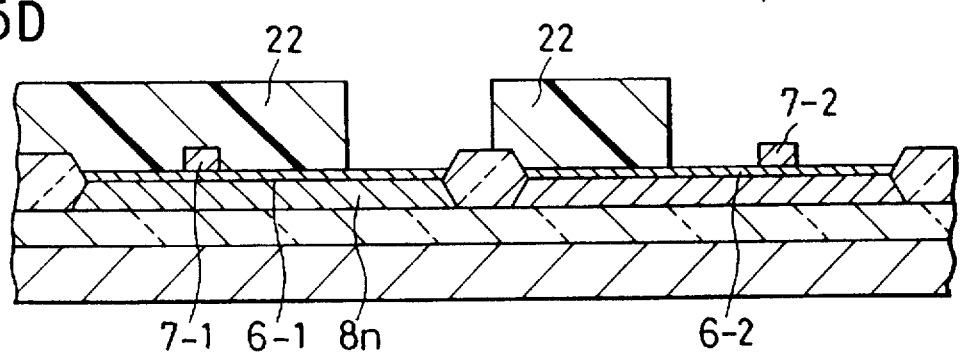

Then, as illustrated in FIG. 5D, a region other than regions in which the NMOS and the heavily doped n-type region 12n of the P+-N-N+ diode are to be formed is covered with photoresist 22, followed by ion-implanting of arsenic (As) at 70 KeV at a dose of about $5 \times 10^{15}$ cm$^{-2}$. As a result, there are formed the n-type source region 9ns, the n-type drain region 9nd and the heavily doped n-type region 12n illustrated in FIG. 5E. Since a region disposed just beneath the second gate electrode 7-2 is not doped with arsenic, the region remains as it is as the first lightly doped p-type region 8p.

Figure 5E:
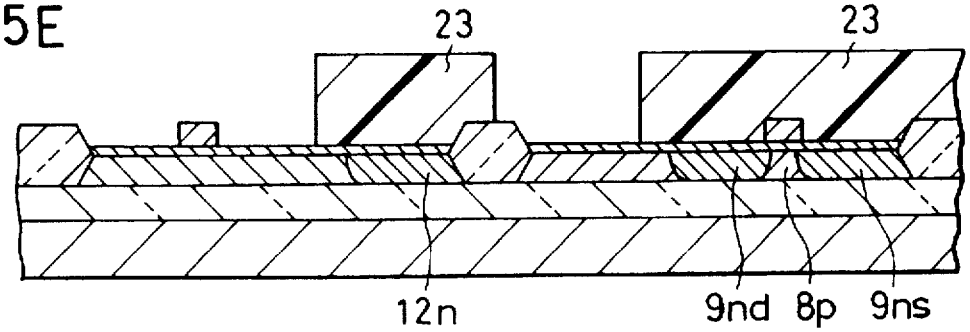

Then, as illustrated in FIG. 5E, subsequently to removal of the photoresist 22, a region other than regions in which the PMOS and the heavily doped p-type region 12p of the N+-P-P+ diode are to be formed is covered with photoresist 23, followed by ion-implanting of BF$_2$ at 50 KeV at a dose of about $5 \times 10^{15}$ cm$^{-2}$. As a result, there are formed the p-type source region 9ps, the p-type drain region 9pd and the heavily doped p-type region 12p illustrated in FIGS. 4A and 4B. Since a region located just beneath the gate electrode 7-1 is not doped with BF$_2$, the region remains as it is as the first lightly doped n-type region 8n. Similarly, a region sandwiched between the p-type drain region 9pd and the heavily doped n-type region 12n remains undoped as the second lightly doped n-type region 11n having the same impurity concentration as the first lightly doped n-type region 8n, and a region sandwiched between the n-type drain region 9nd and the heavily doped p-type region 12p remains undoped as the second lightly doped p-type region 11p having the same impurity concentration as the first lightly doped p-type region 8p.

Then, a resultant is covered with an interlayer insulating film 13, through which the contact holes C1 to C3 are formed. Then, there is deposited an aluminum alloy film, which is then patterned to thereby form the first power supply line 14, second power supply line 15 and output signal line 17.

As having been described, the method of fabricating the SOI semiconductor device is different from the method of fabricating a conventional SOI semiconductor device only in areas to be covered with the photoresist 22 and 23 for ion-implanting of As and BF$_2$ in the steps illustrated in FIGS. 5D and 5E. Thus, the SOI semiconductor device made in accordance with the first embodiment can be fabricated with the same steps as those of the method of fabricating a conventional SOI semiconductor device, namely the steps illustrated in FIGS. 2A to 2E. Accordingly, it is not difficult to construct an output buffer, which has the possibility of electrostatic breakdown, in accordance with the embodiment with a structure of an internal circuit of the SOI semiconductor device being kept unchanged from that of a conventional SOI semiconductor device illustrated in FIGS. 1A and 1B.

In the above mentioned embodiment, the P+-N-N+ diode is formed adjacent to the p-type drain region 9pd of PMOS and the N+-P-P+ diode is formed adjacent to the n-type drain region 9nd of NMOS. However, it should be noted that only the N+-P-P+ diode may be formed adjacent to the n-type drain region 9nd of NMOS, and there is not formed a diode adjacent to PMOS similarly to a conventional SOI semiconductor device, because it is when a negative voltage is applied to an output terminal that the resistance against electrostatic breakdown is significantly reduced in a conventional SOI semiconductor device. It is obvious that such a construction can provide the same resistance against electrostatic breakdown as the above mentioned embodiment, and can be fabricated with the same steps as those of a conventional method of fabricating an SOI semiconductor device.

Figure 6:
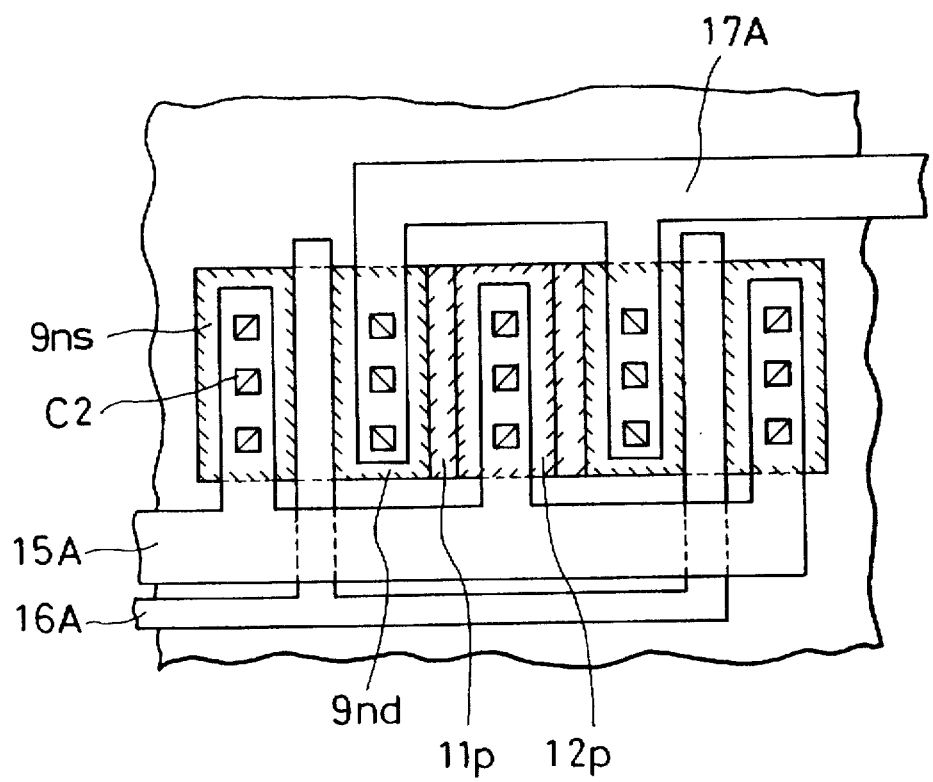
FIG. 6 is a plan view illustrating a variant of the SOI semiconductor device made in accordance with the first embodiment.

The present invention can be applied to an inverter including one of NMOS and PMOS transistors, as well as to CMOS inverter. As an example, FIG. 6 illustrates an NMOS open drain type circuit. An output signal line 17A is connected to a bonding pad (not illustrated) acting as an external terminal of an SOI chip, and also to a terminal of a voltage supply through a pull-up resistor (not illustrated). Herein, the voltage supply may be different from the above mentioned voltage supply $V_{DD}$. When a positive excessive voltage is applied to the output signal line 17A, the NPN bipolar transistor constituted of the n+-type drain region 9nd, the first lightly doped p-type region 8p and the n+-type source region 9ns is turned on, whereas when a negative excessive voltage is applied to the output signal line 17A, the PN diode constituted of the p+-type region 12p, the second lightly doped p-type region 11p and the n+-type drain region 9nd is turned on. Thus, it would be obvious to those skilled in the art that the first embodiment can be applied to a PMOS open drain type circuit.

Figure 7A:
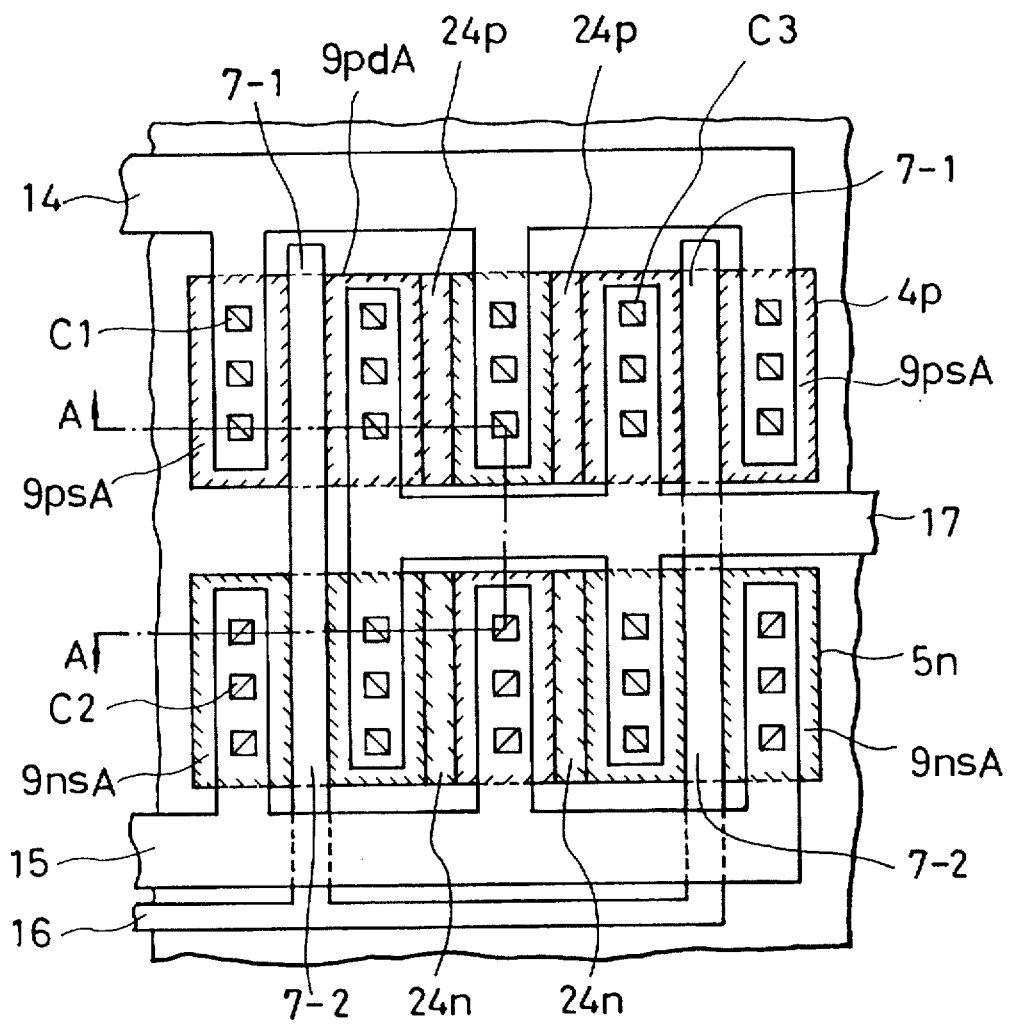
FIG. 7A is a plan view illustrating an output buffer of an SOI semiconductor device made in accordance with the second embodiment of the present invention.
Figure 7B:
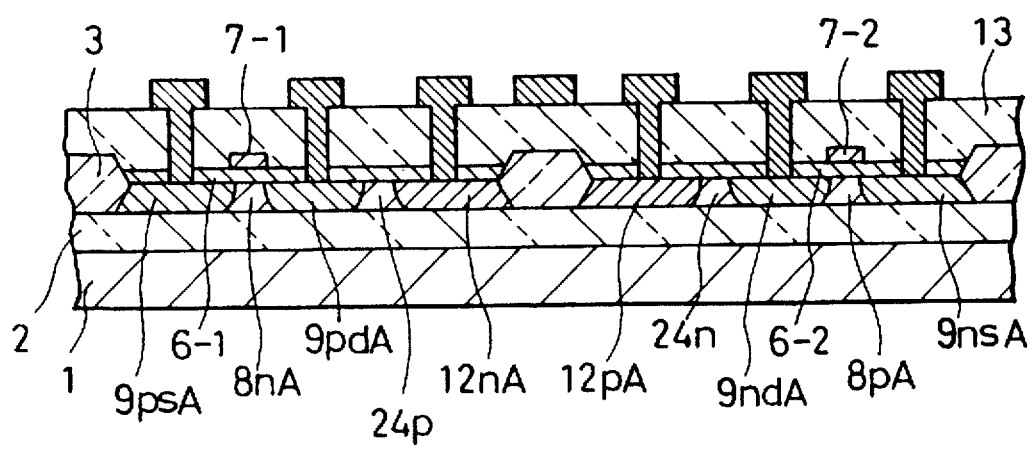
FIG. 7B is a cross-sectional view taken along the line A—A in FIG. 7A.

With reference to FIGS. 7A and 7B, an SOI semiconductor device to be fabricated in accordance with the second embodiment of the present invention includes a p-channel MOS FET and a PN diode formed adjacent to the p-channel MOS FET, an n-channel MOS FET and an NP diode formed adjacent to the n-channel MOS FET, and an output buffer.

The p-channel MOS FET includes a buried oxide film 2 acting as an insulator, a first silicon film selectively covering the buried oxide film 2 to thereby form a first device formation region 4p, a first gate insulating film 6-1 with which the first device formation region 4p is covered, a first gate electrode 7-1 formed on the first gate insulating film 6-1, a first lightly doped n-type region 8nA containing impurities at a dose of about $1\times10^{17}$ cm$^{-3}$ and formed in the first silicon film just beneath the first gate electrode 7-1 across the first gate insulating film 6-1, and heavily doped p-type source and drain regions 9psA and 9pdA both containing at a dose of $1\times10^{20}$ cm$^{-3}$ and formed in the first silicon film in self-aligned fashion about the first gate electrode 7-1 so that the first lightly doped n-type region 8nA is sandwiched between the p-type source and drain regions 9psA and 9pdA.

The SOI semiconductor device also includes a second lightly doped p-type region 24p formed in the first silicon film in adjacent relation to the heavily doped p-type drain region 9pdA, and a first heavily doped n-type region 12nA formed in the first silicon film in adjacent relation to the second lightly doped p-type region 24p. The p-type drain region 9pdA, the second lightly doped p-type region 24p and the first heavily doped n-type region 12nA cooperate with one another to constitute the PN diode.

The n-channel MOS FET includes a second silicon film with which the buried oxide film 2 is selectively covered to form a second device formation region 5n, a second gate insulating film 6-2 with which the second device formation region 5n is covered, a second gate electrode 7-2 formed on the second gate insulating film 6-2, a first lightly doped p-type region 8pA containing impurities at a dose of about $1\times10^{17}$ cm$^{-3}$ and formed in the second silicon film just beneath the second gate electrode 7-2 across the second gate insulating film 6-2, and heavily doped n-type source and drain regions 9nsA and 9ndA both containing impurities at a dose of about $1\times10^{20}$ cm$^{-3}$ and formed in the second silicon film in self-aligned fashion about the second gate electrode 7-2 so that the first lightly doped p-type region 8pA is sandwiched between the n-type source and drain regions 9nsA and 9ndA.

The SOI semiconductor device also includes a lightly doped n-type region 24n formed in the second silicon film in adjacent relation to the heavily doped n-type drain region 9ndA, and a heavily doped p-typed region 12pA formed in the second silicon film in adjacent relation to the lightly doped n-type region 24n. The n-type drain region 9ndA, the lightly doped n-type region 24n and the heavily doped p-typed region 12pA cooperate with one another to constitute the NP diode.

The output buffer includes a first power supply line ($V_{DD}$ line) 14 electrically connected to both the heavily doped p-type source region 9psA and the heavily doped n-type region 12nA, a second power supply line (GND line) 15 electrically connected to both the heavily doped n-type source region 9nsA and the heavily doped p-type region 12pA, an input signal line 16 electrically connected to both the first and second gate electrodes 7-1 and 7-2, and an output signal line 17 electrically connected to both the heavily doped p-type and n-type drain regions 9pdA and 9ndA.

When a negative voltage of about thousands of volts is instantaneously applied to the output signal line 17, the N+-N-P+ diode constituted of the n-type drain region 9ndA, the second n-type region 24n and the heavily doped p-type region 12pA is forward biased to thereby make it possible to provide electric charges to the output signal line 17 through the GND line 15. Thus, there can be obtained the enhanced resistance against electrostatic breakdown for a negative voltage relative to a conventional SOI semiconductor device illustrated in FIGS. 1A and 1B. The P+-N-P+ bipolar transistor constituted of the p+ type drain region 9pdA, the first lightly doped n-type region 8nA and the p+ type source region 9psA may be turned on, but it is not so effective for enhancing the resistance against electrostatic breakdown.

When a positive voltage of thousands of volts is instantaneously applied to the output signal line 17, the NPN bipolar transistor constituted of the n-type source region 9nsA, the p-type body region or the first lightly doped p-type region 8pA and the n-type drain region 9ndA which act as an emitter, a base and a collector, respectively, is turned on to thereby cause electric charges to be discharged from the output signal line 17 to the GND line 15. In addition, the P+-N-N+ diode constituted of the p-type drain region 9pdA, the second lightly doped p-type region 24p and the heavily doped n-type region 12nA is forward biased to thereby discharge electric charges to the $V_{DD}$ line 14. Thus, there can be obtained the enhanced resistance against electrostatic breakdown also for a positive voltage relative to a conventional SOI semiconductor device illustrated in FIGS. 1A and 1B, similarly to the first embodiment.

In normal operation, similarly to the first embodiment, neither the P+ P-N+ diode nor the N+-N-P+ diode is forward biased, resulting in that no harmful influence exerts on operation of the SOI semiconductor device.

Hereinbelow is explained a method of fabricating the SOI semiconductor device of the second embodiment with reference to FIGS. 8A to 8E.

Figure 8A:
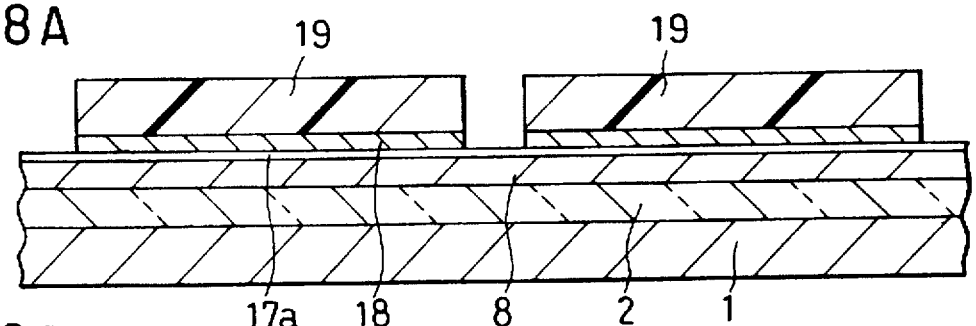
FIGS. 8A to 8E are cross-sectional views of the SOI semiconductor device illustrated in FIGS. 7A and 7B, showing respective step of a method of fabricating the same.

First, a pad oxide film 17a and a silicon nitride film 18 are formed on an SOI substrate having been fabricated by means of SIMOX (Separation by Implanted Oxygen) technique, as illustrated in FIG. 8A. The SOI substrate comprises a silicon substrate 1, a buried oxide film 2 and a silicon film 8. Then, the silicon nitride film 18 is etched by using a patterned photoresist 19 as a mask to thereby separate the silicon film 8 into device formation regions 5n and 4p.

Figure 8B:
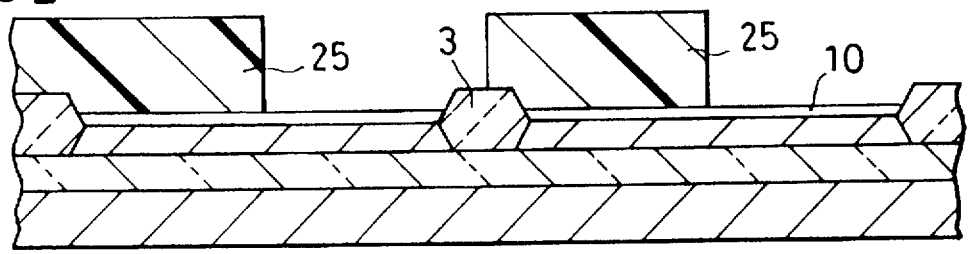

Then, after removal of the photoresist 19, the silicon film 8 is selectively oxidized by using the silicon nitride film 18 as a mask to thereby form a plurality of field oxides 3 defining the device formation regions therein, as illustrated in FIG. 8B. The silicon nitride film 18 and pad oxide film 17a are removed, and then silicon dioxide films 10 having a thickness of 20 nm are made grown on the silicon film 8.

Then, a region other than a region in which the NMOS and a p-type region and an N+-type region of the P+-P-N+ diode are to be formed is covered with photoresist 25, followed by ion-implanting of boron (B) at 50 KeV at a dose of $1\times10^{12}$ cm$^{-2}$ by using the photoresist 25 as a mask. As a result, there are formed the lightly doped p-type region 8pA and 24p illustrated in FIG. 8C.

Then, after removal of the photoresist 25, a region other than a region in which the PMOS and an n-type region and a P+-type region of the N+-N-P+ diode are to be formed is covered with photoresist 26, followed by ion-implanting of phosphorus (P) at 50 KeV at a dose of $1\times10^{12}$ cm$^{-2}$ by using the photoresist 26 as a mask. As a result, there are formed the lightly doped p-type region 8nA and 24n illustrated in FIG. 8D.

After removal of the photoresist 26 and the silicon dioxide films 10, gate oxide films 6-1 and 6-2 having a thickness of 10 nm are made grown on the lightly doped p-type and n-type regions 8pA and 8nA. Then, polysilicon films having a thickness of 300 nm are deposited over the gate oxide films 6-1 and 6-2, followed by diffusion of phosphorus (P) at 850° C. for about 30 minutes. Then, a photoresist using step is carried out to thereby form the first and second gate electrodes 7-1 and 7-2 both composed of a heavily doped n-type polysilicon film.

Figure 8C:
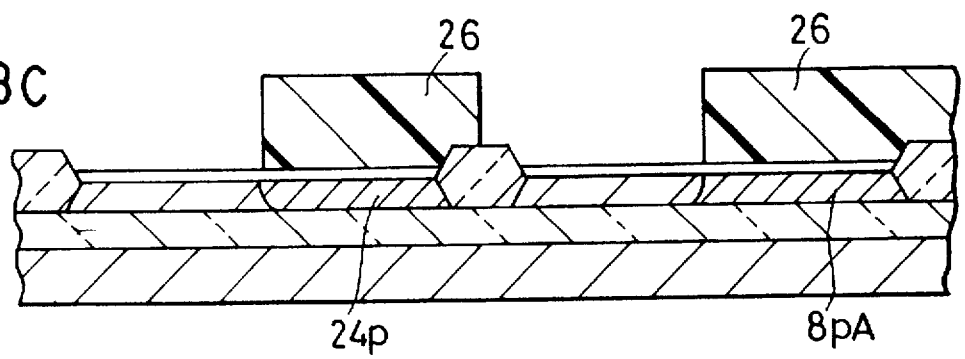
Figure 8D:
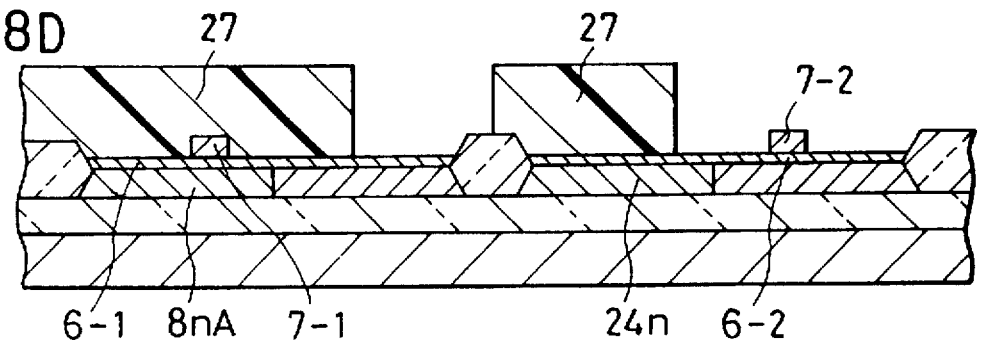

Then, as illustrated in FIG. 8D, a region other than regions in which the NMOS and the heavily doped n-type region 12nA of the P+-P-N+ diode are to be formed is covered with photoresist 27, followed by ion-implanting of arsenic (As) at 70 KeV at a dose of about $5 \times 10^{15}$ cm$^{-2}$. As a result, there are formed the n-type source region 9nsA, the n-type drain region 9ndA and the heavily doped n-type region 12nA illustrated in FIG. 8E. Since a region disposed just beneath the second gate electrode 7-2 is not doped with arsenic, the region remains as it is as the first lightly doped p-type region 8pA.

Figure 8E:
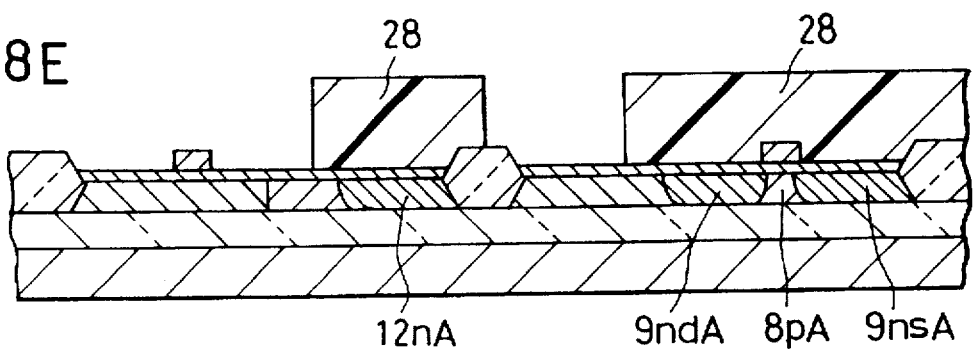

Then, as illustrated in FIG. 8E, subsequently to removal of the photoresist 27, a region other than regions in which the PMOS and the heavily doped p-type region 12pA of the N+-N-P+ diode are to be formed is covered with photoresist 28, followed by ion-implanting of $BF_2$ at 50 KeV at a dose of about $5 \times 10^{15}$ cm$^{-2}$. As a result, there are formed the p-type source region 9psA, the p-type drain region 9pdA and the heavily doped p-type region 24p illustrated in FIGS. 7A and 7B. Since a region located just beneath the gate electrode 7-1 is not doped with $BF_2$, the region remains as it is as the first lightly doped n-type region 8nA. Similarly, a region sandwiched between the p-type drain region 9pdA and the heavily doped n-type region 12nA remains undoped as the second lightly doped p-type region 24p having the same impurity concentration as the first lightly doped p-type region 8pA, and a region sandwiched between the n-type drain region 9ndA and the heavily doped p-type region 12pA remains undoped as the second lightly doped n-type region 24n having the same impurity concentration as the first lightly doped n-type region 8nA.

Then, a resultant is covered with an interlayer insulating film 13, through which the contact holes C1 to C3 are formed. Then, there is deposited an aluminum alloy film, which is then patterned to thereby form the first power supply line 14, second power supply line 15 and output signal line 17.

As having been described, the method of fabricating the SOI semiconductor device in the second embodiment is different from the method of fabricating the SOI semiconductor device in the first embodiment illustrated in FIGS. 5A to 5E only in areas to be covered with the photoresist 25 and 26 for ion-implanting of B and P in the steps illustrated in FIGS. 8B and 8C. Accordingly, similarly to the first embodiment, it is not difficult to construct an output buffer, which has the possibility of electrostatic breakdown, in accordance with the second embodiment with a structure of an internal circuit of the SOI semiconductor device being kept unchanged from that of a conventional SOI semiconductor device illustrated in FIGS. 1A and 1B.

In the above mentioned embodiment, the P+-P-N+ diode is formed adjacent to the p-type drain region 9pdA of PMOS and the N+-N-P+ diode is formed adjacent to the n-type drain region 9ndA of NMOS. However, it should be noted that only the N+-N-P+ diode may be formed adjacent to the n-type drain region 9ndA of NMOS, and there is not formed a diode adjacent to PMOS, similarly to the first embodiment.

In addition, similarly to the first embodiment, the second embodiment can be applied to an open drain type output buffer.

Hereinbelow will be described an SOI semiconductor device made in accordance with the third embodiment of the present invention.

Figure 9A:
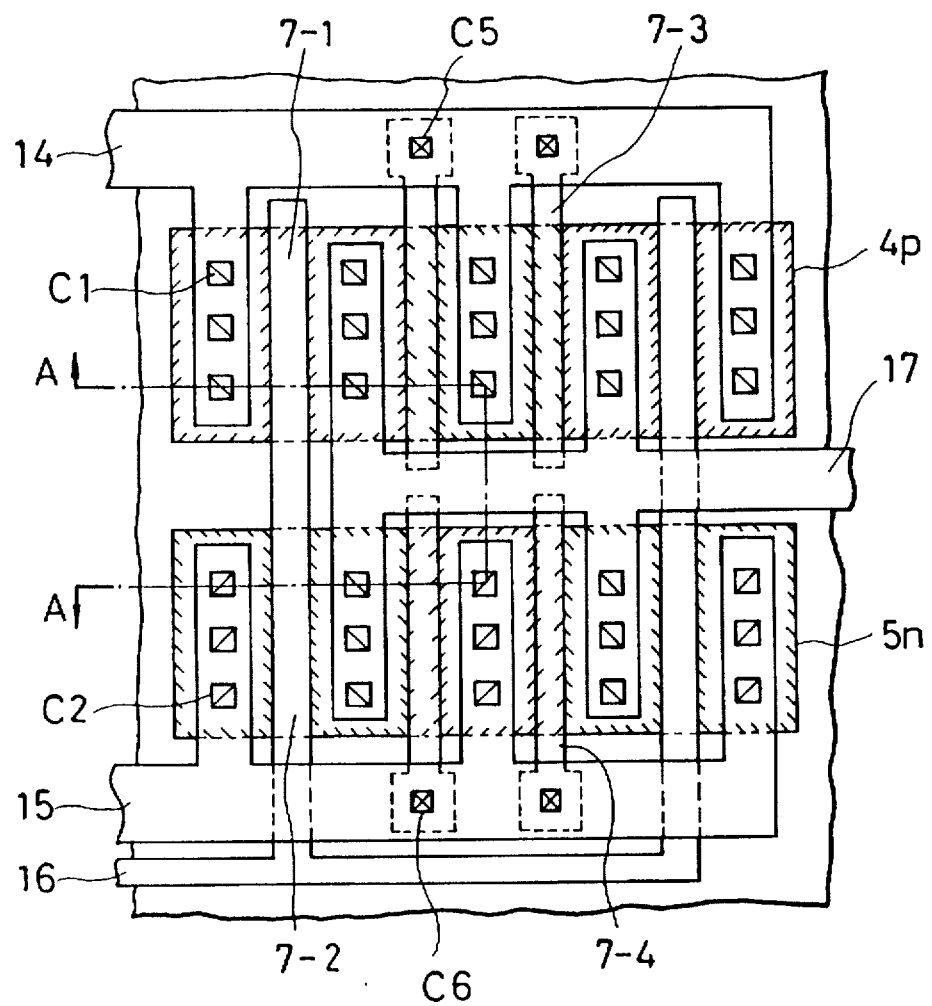
FIG. 9A is a plan view illustrating an output buffer of an SOI semiconductor device made in accordance with the third embodiment of the present invention.
Figure 9B:
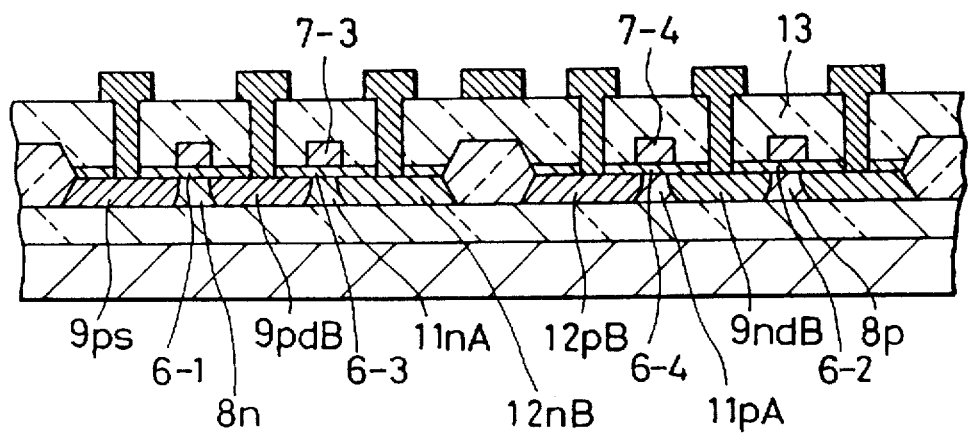
FIG. 9B is a cross-sectional view taken along the line A—A in FIG. 9A.

As illustrated in FIGS. 9A and 9B, the SOI semiconductor device of the third embodiment has the same structure as the first embodiment, but further includes a third gate electrode 7-3 located above the second lightly doped n-type region 11nA across a third gate insulating film 6-3 and electrically connected to the first power supply line 14 through a contact hole C5, and a fourth gate electrode 7-4 located above the second lightly doped p-type region 11pA across a fourth gate insulating film 6-4 and electrically connected to the second power supply line 15 through a contact hole C6. The third and fourth gate insulating films 6-3 and 6-4 are formed concurrently with the gate insulating films 6-1 and 6-2, respectively. The SOI semiconductor device of the third embodiment operates in the same way as the first embodiment when a positive or negative excessive voltage is applied to the output signal line 17 and in normal state, and thus the explanation of operation is omitted.

Hereinbelow is explained a method of fabricating the SOI semiconductor device of the third embodiment with reference to FIGS. 10A to 10E.

Figure 10A:
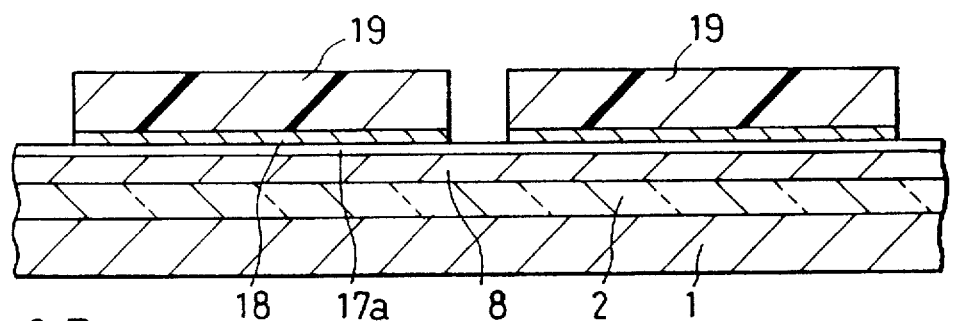
FIGS. 10A to 10E are cross-sectional views of the SOI semiconductor device illustrated in FIGS. 9A and 9B, showing respective step of a method of fabricating the same.

First, a pad oxide film 17a and a silicon nitride film 18 are formed on an SOI substrate having been fabricated by means of SIMOX (Separation by Implanted Oxygen) technique, as illustrated in FIG. 10A. The SOI substrate comprises a silicon substrate 1, a buried oxide film 2 and a silicon film 8. Then, the silicon nitride film 18 is etched by using a patterned photoresist 19 as a mask to thereby separate the silicon film 8 into device formation regions 5n and 4p.

Figure 10B:
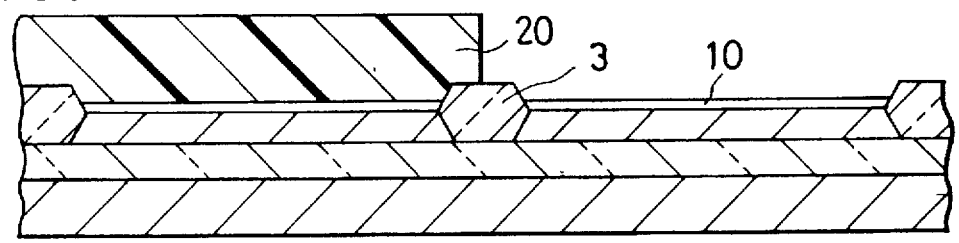
Figure 10C:
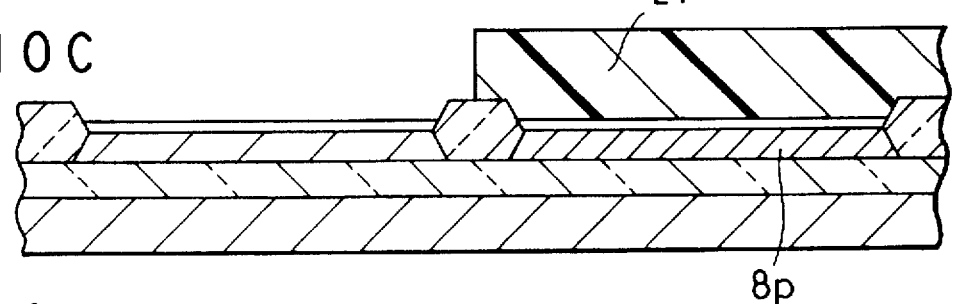

Then, after removal of the photoresist 19, the silicon film 8 is selectively oxidized by using the silicon nitride film 18 as a mask to thereby form a plurality of field oxides 3 defining the device formation regions therein, as illustrated in FIG. 10B. The silicon nitride film 18 and pad oxide film 17a are removed, and then silicon dioxide films 10 having a thickness of 20 nm are made grown on the silicon film 8.

Then, a region other than regions in which the NMOS and N+-P-P+ diode are to be formed is covered with photoresist 20, followed by ion-implanting of boron (B) at 50 KeV at a dose of $1 \times 10^{12}$ cm$^{-2}$ by using the photoresist 20 as a mask. As a result, there is formed the lightly doped p-type region 8p illustrated in FIG. 10C.

Then, after removal of the photoresist 20, a region other than regions in which the PMOS and P+-N-N+ are to be formed is covered with photoresist 21, followed by ion-implanting of phosphorus (P) at 50 KeV at a dose of about $1 \times 10^{12}$ cm$^{-2}$. As a result, there is formed the lightly doped n-type region 8n illustrated in FIG. 10D.

After removal of the photoresist 21 and the silicon dioxide films 10, gate oxide films 6-1 to 6-4 having a thickness of 10 nm are made grown on the lightly doped p-type and n-type regions 8p and 8n. Then, polysilicon films having a thickness of 300 nm are deposited over the gate oxide films 6-1 to 6-4, followed by diffusion of phosphorus (P) at 850° C. for about 30 minutes. Then, a photoresist using step is carried out to thereby form the first gate electrode 7-1, the third gate electrode 7-3 to be used for the formation of an n-type region, the second gate electrode 7-2, and the fourth gate electrode 7-4 to be used for the formation of a p-type region all composed of a heavily doped n-type polysilicon film.

Figure 10D:
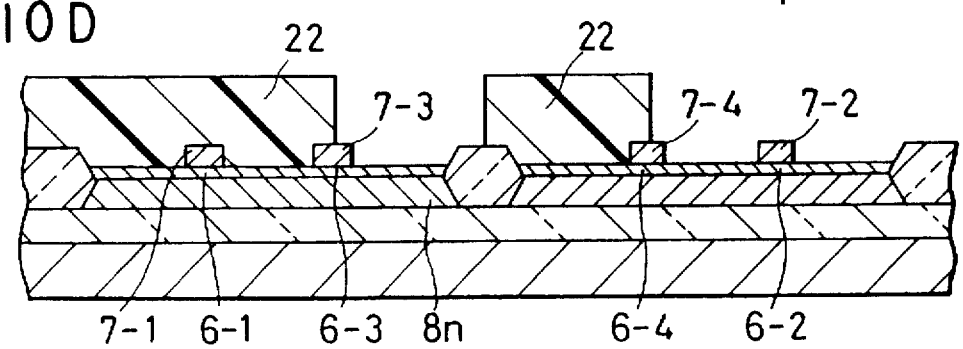

Then, as illustrated in FIG. 10D, a region other than regions in which the NMOS and the heavily doped n-type region 12nB of the P+-N-N+ diode are to be formed is covered with photoresist 22 so that the photoresist 22 terminates on the third and fourth gate electrodes 7-3 and 7-4, followed by ion-implanting of arsenic (As) at 70 KeV at a dose of about $5 \times 10^{15}$ cm$^{-2}$. As a result, there are formed the n-type source region 9ns, the n-type drain region 9ndB and the heavily doped n-type region 12nB illustrated in FIG. 10E. Since a region disposed just beneath the second gate electrode 7-2 is not doped with arsenic, the region remains as it is as the first lightly doped p-type region 8p.

Figure 10E:
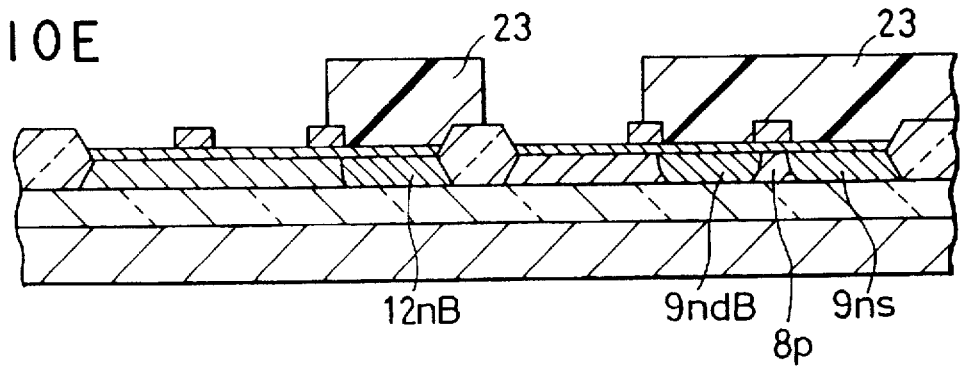

Then, as illustrated in FIG. 10E, subsequently to removal of the photoresist 22, a region other than regions in which the PMOS and the heavily doped p-type region 12pB of the N+-P-P+ diode are to be formed is covered with photoresist 23 so that the photoresist 23 terminates on the third and fourth gate electrodes 7-3 and 7-4, followed by ion-implanting of BF$_2$ at 50 KeV at a dose of about $5 \times 10^{15}$ cm$^{-2}$. As a result, there are formed the p-type source region 9ps, the p-type drain region 9pdB and the heavily doped p-type region 12pB illustrated in FIGS. 9A and 9B. Since a region located just beneath the first gate electrode 7-1 is not doped with BF$_2$, the region remains as it is as the first lightly doped n-type region 8n. Similarly, a region sandwiched between the p-type drain region 9pdB and the heavily doped n-type region 12nB remains undoped as the second lightly doped n-type region 11nA having the same impurity concentration as the first lightly doped n-type region 8n, and a region sandwiched between the n-type drain region 9ndB and the heavily doped p-type region 12pB remains undoped as the second lightly doped p-type region 11pA having the same impurity concentration as the first lightly doped p-type region 8p.

Then, a resultant is covered with an interlayer insulating film 13, through which the contact holes C1 to C5 are formed. Then, there is deposited an aluminum alloy film, which is then patterned to thereby form the first power supply line 14, second power supply line 15 and output signal line 17.

Since the p-type drain region 9pdB and the heavily doped n-type region 12nB are self-aligned about the third gate electrode 7-3, it is possible to accurately control by the third gate electrode 7-3 a width of the n-type region 11nA of the P+ N-N+ diode constituted of the p-type drain region 9pdB, the lightly doped n-type region 11nA and the heavily doped n-type region 12nB. Similarly, since the n-type drain region 9ndB and the heavily doped p-type region 12pB are self-aligned about the fourth gate electrode 7-4, it is possible to accurately control by the fourth gate electrode 7-4 a width of the p-type region 11pA of the N+-P-P+ diode constituted of the n-type drain region 9ndB, the lightly doped p-type region 11pA and the heavily doped p-type region 12pB. Thus, there is provided an advantage of smaller dispersion in diode characteristic.

As having been described, the SOI semiconductor device in the third embodiment can be fabricated with the same steps as those of the method of fabricating a conventional SOI semiconductor device, namely the steps illustrated in FIGS. 2A to 2E, by forming the third and fourth gate electrodes 7-3 and 7-4 in regions at which photoresist terminates in the step of As ion-implanting illustrated in FIG. 10D or in the step of BF$_2$ ion-implanting illustrated in FIG. 10E. Accordingly, it is not difficult to construct an output buffer, which has the possibility of electrostatic breakdown, in accordance with the third embodiment with a structure of an internal circuit of the SOI semiconductor device being kept unchanged from that of a conventional SOI semiconductor device illustrated in FIGS. 1A and 1B.

In the above mentioned third embodiment, the P+-N-N+ diode is formed adjacent to the p-type drain region 9pdB of PMOS and the N+-P-P+ diode is formed adjacent to the n-type drain region 9ndB of NMOS. However, it should be noted that only the N+-P-P+ diode may be formed adjacent to the n-type drain region 9ndB of NMOS, and there is not formed a diode adjacent to PMOS, because it is when a negative voltage is applied to an output terminal that the resistance against electrostatic breakdown is significantly reduced in a conventional SOI semiconductor device. It is obvious that such a construction can provide the same resistance against electrostatic breakdown as the above mentioned third embodiment, and can be fabricated with the same steps as those of a conventional method of fabricating an SOI semiconductor device.

In the above mentioned embodiments, the description was made taking an SOI semiconductor device fabricated using SIMOX as an example. However, it should be noted that the present invention can be applied to any SOI semiconductor device regardless of whatever method is used to fabricate an SOI substrate thereof.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A silicon on insulator type semiconductor device comprising:

an insulator;

a silicon film with which said insulator is selectively covered to form a device formation region;

a gate insulating film with which said device formation region is covered;

a gate electrode formed on said gate insulating film;

a first lightly doped region having first conductivity and formed in said silicon film below said gate electrode across said gate insulating film;

heavily doped source and drain regions both having second conductivity and formed in said silicon film in self-aligned fashion about said gate electrode so that said first lightly doped region is sandwiched between said source and drain regions, said insulator, silicon film, gate insulating film, gate electrode, first lightly doped region and heavily doped source and drain regions constituting a transistor;

a second lightly doped region having first conductivity and formed in said silicon film in adjacent relation to said heavily doped drain region;

a heavily doped region having first conductivity and formed in said silicon film in adjacent relation to said second lightly doped region;

a power supply line electrically connected to both said heavily doped source region and said heavily doped region;

an input signal line electrically connected to said gate electrode; and an output signal line electrically connected to said heavily doped drain region.

2. The silicon on insulator type semiconductor device as set forth in claim 1, wherein said first conductivity is p-type and said second conductivity is n-type.

3. A silicon on insulator type semiconductor device comprising:

an insulator;

a first silicon film with which said insulator is selectively covered to form a first device formation region;

a first gate insulating film with which said first device formation region is covered;

a first gate electrode formed on said first gate insulating film;

a first lightly doped region having first conductivity and formed in said first silicon film below said first gate electrode across said first gate insulating film;

first heavily doped source and drain regions both having second conductivity and formed in said first silicon film in self-aligned fashion about said first gate electrode so that said first lightly doped region is sandwiched between said first source and drain regions, said insulator, first silicon film, first gate insulating film, first gate electrode, first lightly doped region and first heavily doped source and drain regions constituting a first transistor having a second conductivity channel;

a second lightly doped region having first conductivity and formed in said first silicon film in adjacent relation to said first heavily doped drain region;

a first heavily doped region having first conductivity and formed in said first silicon film in adjacent relation to said second lightly doped region;

a second silicon film with which said insulator is selectively covered to form a second device formation region;

a second gate insulating film with which said second device formation region is covered;

a second gate electrode formed on said second gate insulating film;

a third lightly doped region having second conductivity and formed in said second silicon film below said second gate electrode across said second gate insulating film;

second heavily doped source and drain regions both having first conductivity and formed in said second silicon film in self-aligned fashion about said second gate electrode so that said third lightly doped region is sandwiched between said second source and drain regions, said insulator, second silicon film, second gate insulating film, second gate electrode, third lightly doped region and second heavily doped source and drain regions constituting a second transistor having a first conductivity channel;

a fourth lightly doped region having second conductivity and formed in said second silicon film in adjacent relation to said heavily doped second drain region;

a second heavily doped region having second conductivity and formed in said second silicon film in adjacent relation to said fourth lightly doped region;

a first power supply line electrically connected to both said first heavily doped source region and said first heavily doped region;

a second power supply line electrically connected to both said second heavily doped source region and said second heavily doped region;

an input signal line electrically connected to both said first and second gate electrodes; and an output signal line electrically connected to both said heavily doped first and second drain regions.

4. The silicon on insulator type semiconductor device as set forth in claim 3, wherein said first conductivity is n-type and said second conductivity is p-type.

5. A silicon on insulator type semiconductor device comprising:

an insulator;

a silicon film with which said insulator is selectively covered to form a device formation region;

a gate insulating film with which said device formation region is covered;

a gate electrode formed on said gate insulating film;

a first lightly doped region having first conductivity and formed in said silicon film below said gate electrode across said gate insulating film;

heavily doped source and drain regions both having second conductivity and formed in said silicon film in self-aligned fashion about said gate electrode so that said first lightly doped region is sandwiched between said source and drain regions, said insulator, silicon film, gate insulating film, gate electrode, first lightly doped region and heavily doped source and drain regions constituting a transistor;

a second lightly doped region having second conductivity and formed in said silicon film in adjacent relation to said heavily doped drain region;

a heavily doped region having first conductivity and formed in said silicon film in adjacent relation to said second lightly doped region;

a power supply line electrically connected to both said heavily doped source region and said heavily doped region;

an input signal line electrically connected to said gate electrode; and an output signal line electrically connected to said heavily doped drain region.

6. The silicon on insulator type semiconductor device as set forth in claim 5, wherein said first conductivity is p-type and said second conductivity is n-type.

7. A silicon on insulator type semiconductor device comprising:

an insulator;

a first silicon film with which said insulator is selectively covered to form a first device formation region;

a first gate insulating film with which said first device formation region is covered;

a first gate electrode formed on said first gate insulating film;

a first lightly doped region having first conductivity and formed in said first silicon film below said first gate electrode across said first gate insulating film;

first heavily doped source and drain regions both having second conductivity and formed in said first silicon film in self-aligned fashion about said first gate electrode so that said first lightly doped region is sandwiched between said first source and drain regions, said insulator, first silicon film, first gate insulating film, first gate electrode, first lightly doped region and first heavily doped source and drain regions constituting a first transistor having a second conductivity channel;

a second lightly doped region having second conductivity and formed in said first silicon film in adjacent relation to said first heavily doped drain region;

a first heavily doped region having first conductivity and formed in said first silicon film in adjacent relation to said second lightly doped region;

a second silicon film with which said insulator is selectively covered to form a second device formation region;

a second gate insulating film with which said second device formation region is covered;

a second gate electrode formed on said second gate insulating film;

a third lightly doped region having second conductivity and formed in said second silicon film below said second gate electrode across said second gate insulating film;

second heavily doped source and drain regions both having first conductivity and formed in said second silicon film in self-aligned fashion about said second gate electrode so that said third lightly doped region is sandwiched between said second source and drain regions, said insulator, second silicon film, second gate insulating film, second gate electrode, third lightly doped region and second heavily doped source and drain regions constituting a second transistor having a first conductivity channel;

a fourth lightly doped region having first conductivity and formed in said second silicon film in adjacent relation to said heavily doped second drain region;

a second heavily doped region having second conductivity and formed in said second silicon film in adjacent relation to said fourth lightly doped region;

a first power supply line electrically connected to both said first heavily doped source region and said first heavily doped region;

a second power supply line electrically connected to both said second heavily doped source region and said second heavily doped region;

an input signal line electrically connected to both said first and second gate electrodes; and an output signal line electrically connected to both said heavily doped first and second drain regions.

8. The silicon on insulator type semiconductor device as set forth in claim 7, wherein said first conductivity is n-type and said second conductivity is p-type.

9. The silicon on insulator type semiconductor device as set forth in claim 1 further comprising a second gate electrode formed on said second lightly doped region across a second gate insulating film and electrically connected to said power supply line, said heavily doped drain region and said heavily doped region being self-aligned about said second gate electrode.

10. The silicon on insulator type semiconductor device as set forth in claim 3 further comprising a third gate electrode formed on said second lightly doped region across a third gate insulating film and electrically connected to said first power supply line, and a fourth gate electrode formed on said fourth lightly doped region across a fourth gate insulating film and electrically connected to said second power supply line, said first heavily doped drain region and said first heavily doped region being self-aligned about said third gate electrode, said second heavily doped drain region and said second heavily doped region being self-aligned about said fourth gate electrode.

11. The silicon on insulator type semiconductor device as set forth in claim 5 further comprising a second gate electrode formed on said second lightly doped region across a second gate insulating film and electrically connected to said power supply line, said heavily doped drain region and said heavily doped region being self-aligned about said second gate electrode.

12. The silicon on insulator type semiconductor device as set forth in claim 7 further comprising a third gate electrode formed on said second lightly doped region across a third gate insulating film and electrically connected to said first power supply line, and a fourth gate electrode formed on said fourth lightly doped region across a fourth gate insulating film and electrically connected to said second power supply line, said first heavily doped drain region and said first heavily doped region being self-aligned about said third gate electrode, said second heavily doped drain region and said second heavily doped region being self-aligned about said fourth gate electrode.

13. A silicon on insulator type semiconductor device comprising a transistor, a diode and a power source line, said transistor including;

an insulator;

a silicon film with which said insulator is selectively covered to form a device formation region;

a gate insulating film which said device formation region is covered;

a gate electrode formed on said gate insulating film;

a region having first conductivity and formed in said silicon film below said gate electrode across said gate insulating film; and source and drain regions both having second conductivity and formed in said silicon film in self-aligned fashion about said gate electrode so that said region is sandwiched between said source and drain regions, said diode being in electrical connection with said transistor through said drain region, said region being in electrical isolation with said diode, both said diode and said source region of said transistor being electrically connected to said power source line so that said diode is forward biased to provide a path for electric charges running therethrough when an excessive potential is applied to said drain region of said transistor.

14. The silicon on insulator type semiconductor device set forth in claim 13, wherein said transistor is an n-channel MOS FET, and said diode is an np-type diode.

15. The silicon on insulator type semiconductor device set forth in claim 14, wherein said diode is an n+-p-p+ type diode.

16. The silicon on insulator type semiconductor device set forth in claim 14, wherein said diode is an n+-n-p+ type diode.

17. The silicon on insulator type semiconductor device set forth in claim 13, wherein said transistor is a p-channel MOS FET, and said diode is an pn-type diode.

18. The silicon on insulator type semiconductor device set forth in claim 17, wherein said diode is an p+-n-n+ type diode.

19. The silicon on insulator type semiconductor device set forth in claim 17, wherein said diode is an p+-p-n+ type diode.

* * * * *